(12) United States Patent
Staszewski et al.

(10) Patent No.: US 8,130,040 B2
(45) Date of Patent: Mar. 6, 2012

(54) POWER AMPLIFIER WITH TWO TRANSISTORS AND TRACES FORMING TWO TRANSFORMERS

(75) Inventors: Robert Bogdan Staszewski, Garland, TX (US); See Taur Lee, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 12/830,898

(22) Filed: Jul. 6, 2010

(65) Prior Publication Data

US 2010/0271131 A1 Oct. 28, 2010

Related U.S. Application Data

(62) Division of application No. 12/563,528, filed on Sep. 21, 2009, now Pat. No. 7,777,572, which is a division of application No. 11/860,392, filed on Sep. 24, 2007, now Pat. No. 7,612,612.

(60) Provisional application No. 60/945,643, filed on Jun. 22, 2007.

(51) Int. Cl.
 *H03F 3/68* (2006.01)

(52) U.S. Cl. ................... 330/295; 330/124 R

(58) Field of Classification Search ............ 330/84, 330/124 R, 126, 252, 295
See application file for complete search history.

(56) References Cited

U.S. PATENT DOCUMENTS

| | | | | |
|---|---|---|---|---|
| 3,911,372 | A * | 10/1975 | Seidel | 330/286 |
| 5,070,304 | A * | 12/1991 | Salib et al. | 330/54 |
| 7,486,141 | B2 * | 2/2009 | Do et al. | 330/276 |
| 7,834,686 | B2 * | 11/2010 | Staszewski et al. | 330/51 |

* cited by examiner

*Primary Examiner* — Henry Choe
(74) *Attorney, Agent, or Firm* — Lawerence J. Bassuk; W. James Brady; Frederick J. Telecky, Jr.

(57) ABSTRACT

Methods to implement low cost, high efficiency, low loss power combiner with novel matching circuits are disclosed. A narrow band power combiner enables a high power and high efficiency radio frequency power amplifier to be realized using multiple low voltage CMOS transistors or micro power amplifiers. The power combiner may be printed on a package substrate and realized either using single layer substrate through edge coupling or multiple layers substrate through broadside coupling. The micro power amplifiers may be fabricated using low voltage CMOS technology and electrical connections between the outputs from the micro power amplifiers and the power combiner may be provided through stud bumps in a flip chip technology. With the tunable matching circuits, the present invention allows the narrow band power combiner to be tuned to different frequencies.

4 Claims, 19 Drawing Sheets

Figure 1:
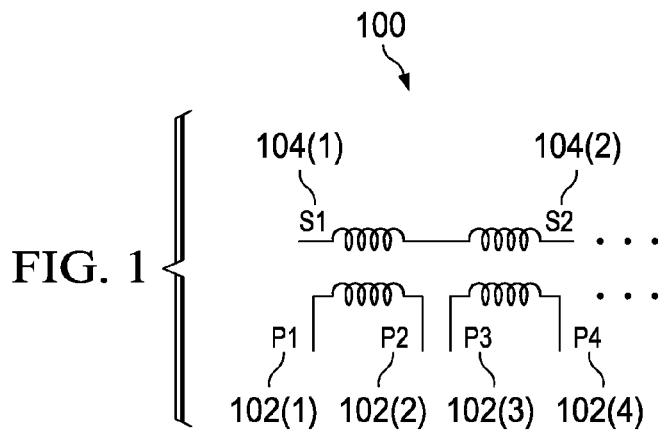

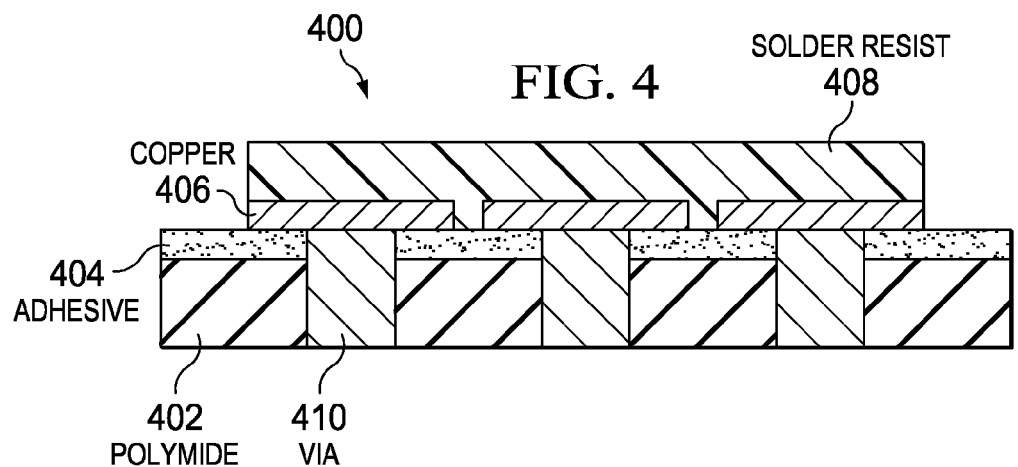
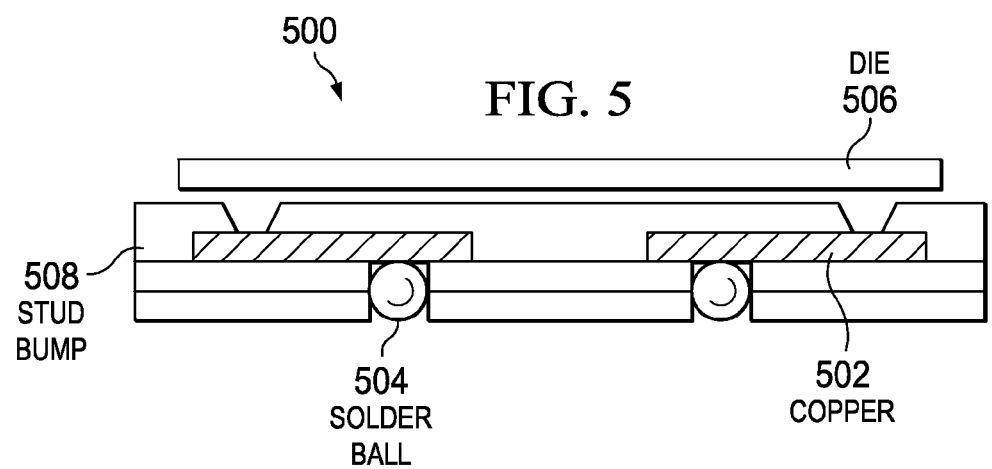

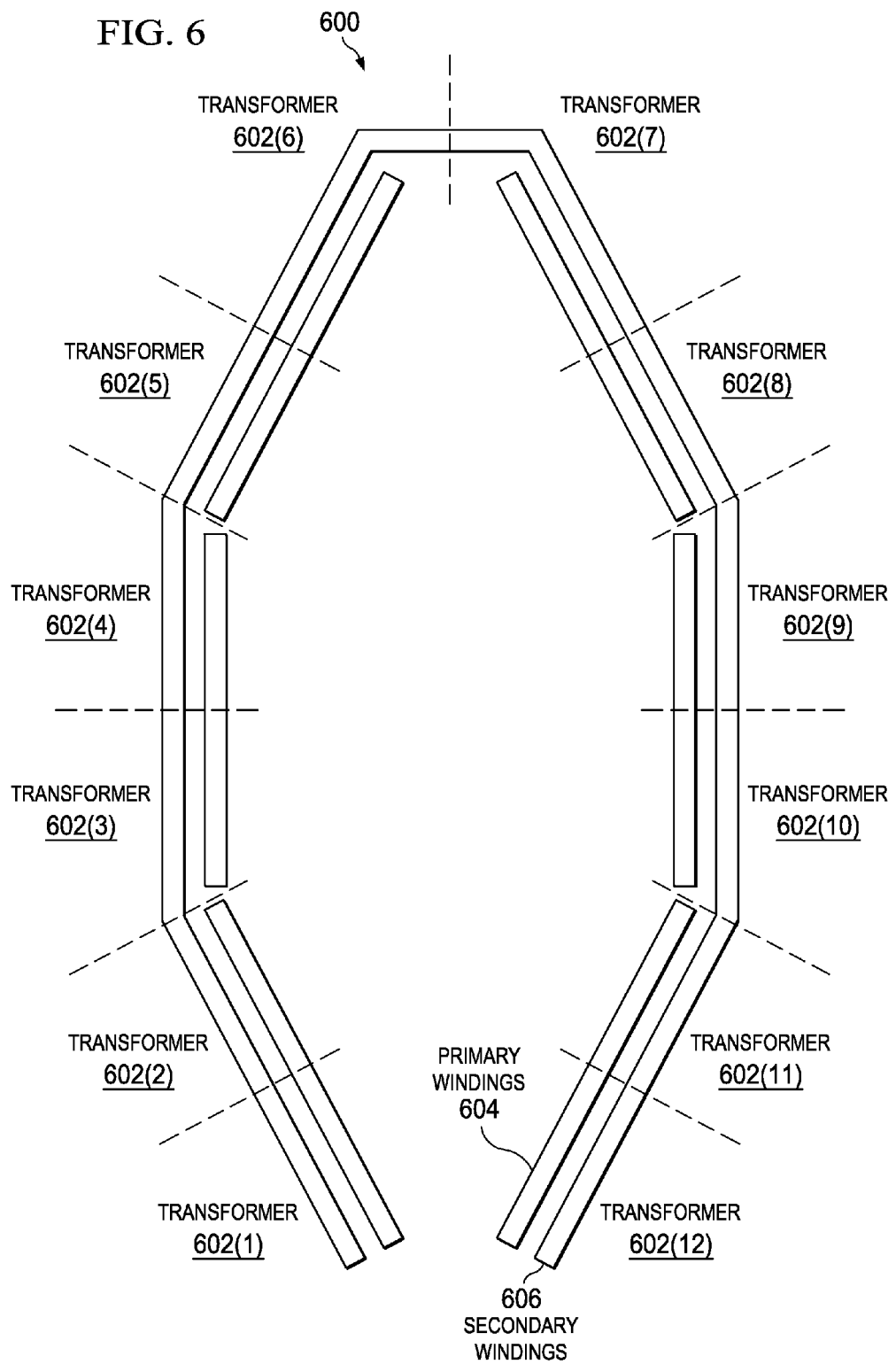

US 8,130,040 B2

POWER AMPLIFIER WITH TWO TRANSISTORS AND TRACES FORMING TWO TRANSFORMERS

RELATED APPLICATIONS

This application is a divisional of application Ser. No. 12/563,528, filed Sep. 21, 2009, now U.S. Pat. No. 7,777,572 issued Aug. 17, 2010.;
Which is a divisional of application Ser. No. 11/860,392, filed Sep. 24, 2007, now U.S. Pat. No. 7,612,612, granted Nov. 3, 2009;
Which claims priority under 35 U.S.C. .sctn. 119(e) to U.S. Provisional Application No. 60/945,643 filed Jun. 22, 2007, the disclosure of which is incorporated herein.

BACKGROUND

Power amplifiers are used in applications such as wireless cellular handsets. Wireless cellular devices may implement technologies that typically need particular power requirements. Traditionally, power amplifiers have used GaAs and/or SiGe bipolar transistor technologies which have available high voltage breakdown devices.

It is ideal to integrate power amplifiers with transceiver and baseband circuits as a single chip; however, due to voltage scaling in nanometer scale (nanoscale) technology, the amount of power that a single transistor can deliver typically is quite limited (e.g., 8 dBm).

Since there are limitations in scaling, output resistance, and in order to deliver the same amount of output power that a power amplifier can deliver, multiple transistors or micro power amplifiers can be designed and a power combiner can be used to combine the output power from each micro power amplifier; however, consideration is to be made to assure that the final product has high efficiency. In other words, a power combiner should be power efficient and have low loss. The power combiner would typically be realized as a transformer network, in which a desired individual transformer would require high coupling factor and high inductances on the primary and secondary windings. Manufacturing of such a low-loss, compact and highly efficient transformer network in a large-volume low-cost nanoscale CMOS process and associated packaging technologies would be very difficult to realize.

An additional component that significantly affects the transmitter power efficiency is a frequency band switch coupling the power amplifier(s) to the antenna. To improve power transfer efficiency at RF frequencies, a typical power amplifier must be tuned to a relatively narrow frequency range (e.g., 10-100 MHz centered around 900 MHz or 1800 MHz) with an LC matching circuit. To cover various frequency bands that a handset is specified to cover, multiple power amplifiers or multiple output stages, each terminated with its own matching circuit, are employed. Selecting the desired PA output is a difficult task as it requires expensive high-power-rated switches, typically implemented in pHEMPT technology. The non-zero resistance of the switches contribute 0.5-1 dB of power loss, therefore their elimination would greatly improve the overall TX efficiency. The switches also have finite isolation between ports, therefore their elimination would help to reduce leakage and thus improve dynamic range.

Furthermore, varying antenna loading environment becomes more and more critical in today's environment of ever decreasing form factor of handset cell phones. The antenna load mismatch results in more reflected power and thus less power emitted by the antenna. Therefore, it is desirable to be able to compensate for the antenna mismatch with a controllable matching circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In an embodiment, a power combiner has multiple transformers, the transformers include primary windings and secondary windings connected in series; and multiple micro amplifiers configured as pairs, wherein the micro amplifiers are connected to the power combiner.

BRIEF DESCRIPTION OF THE CONTENTS

Figure 3:
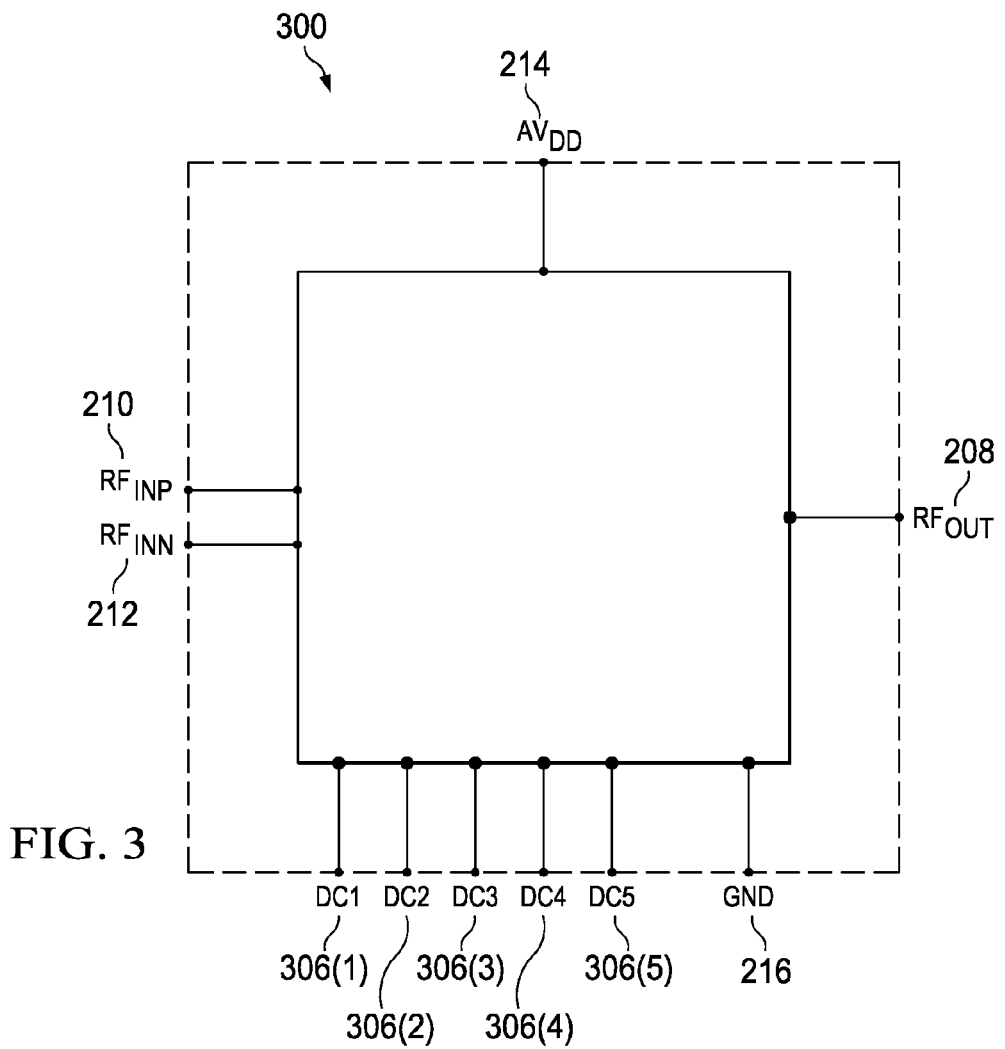
Figure 2:
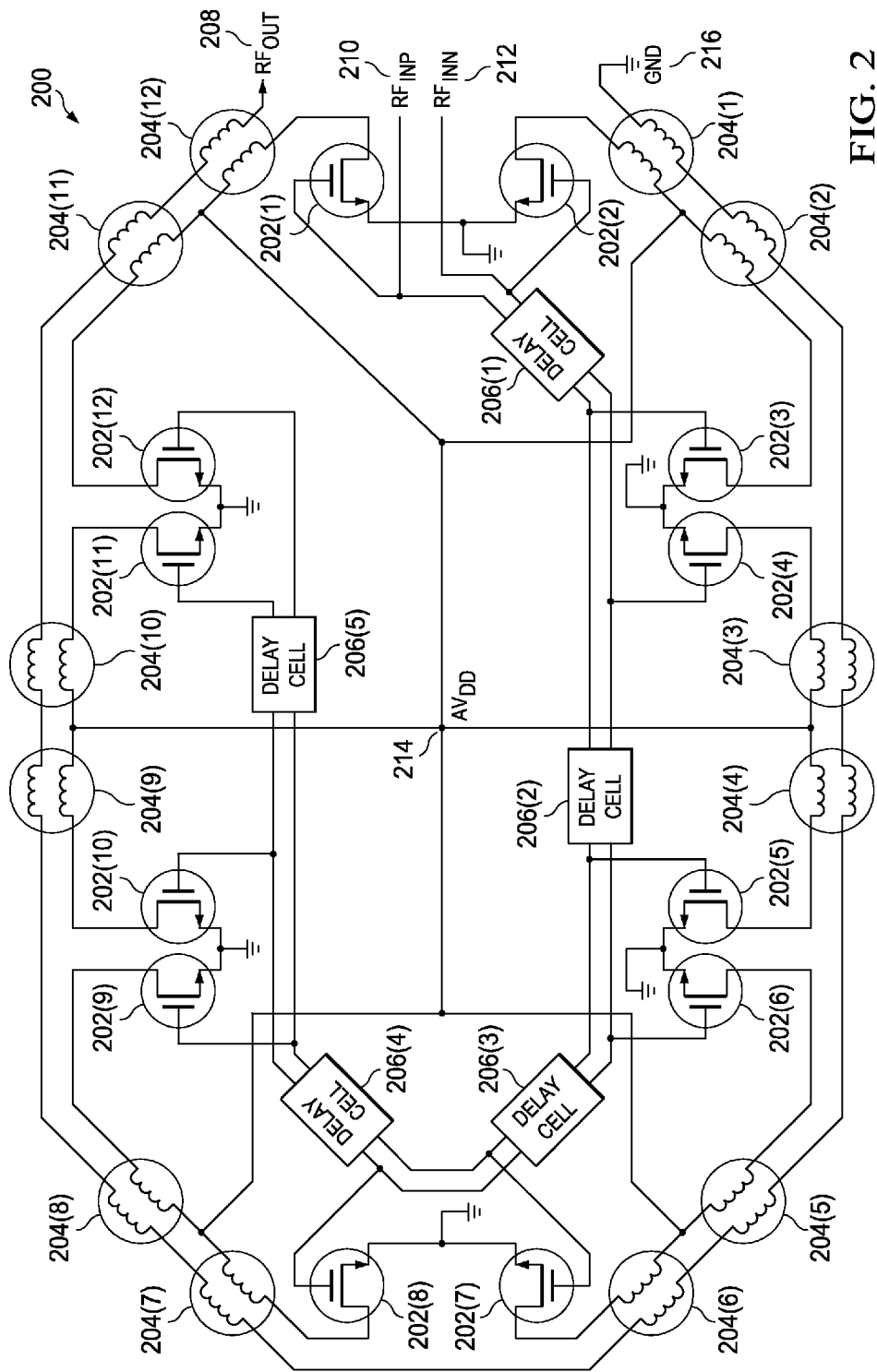
Figure 7:
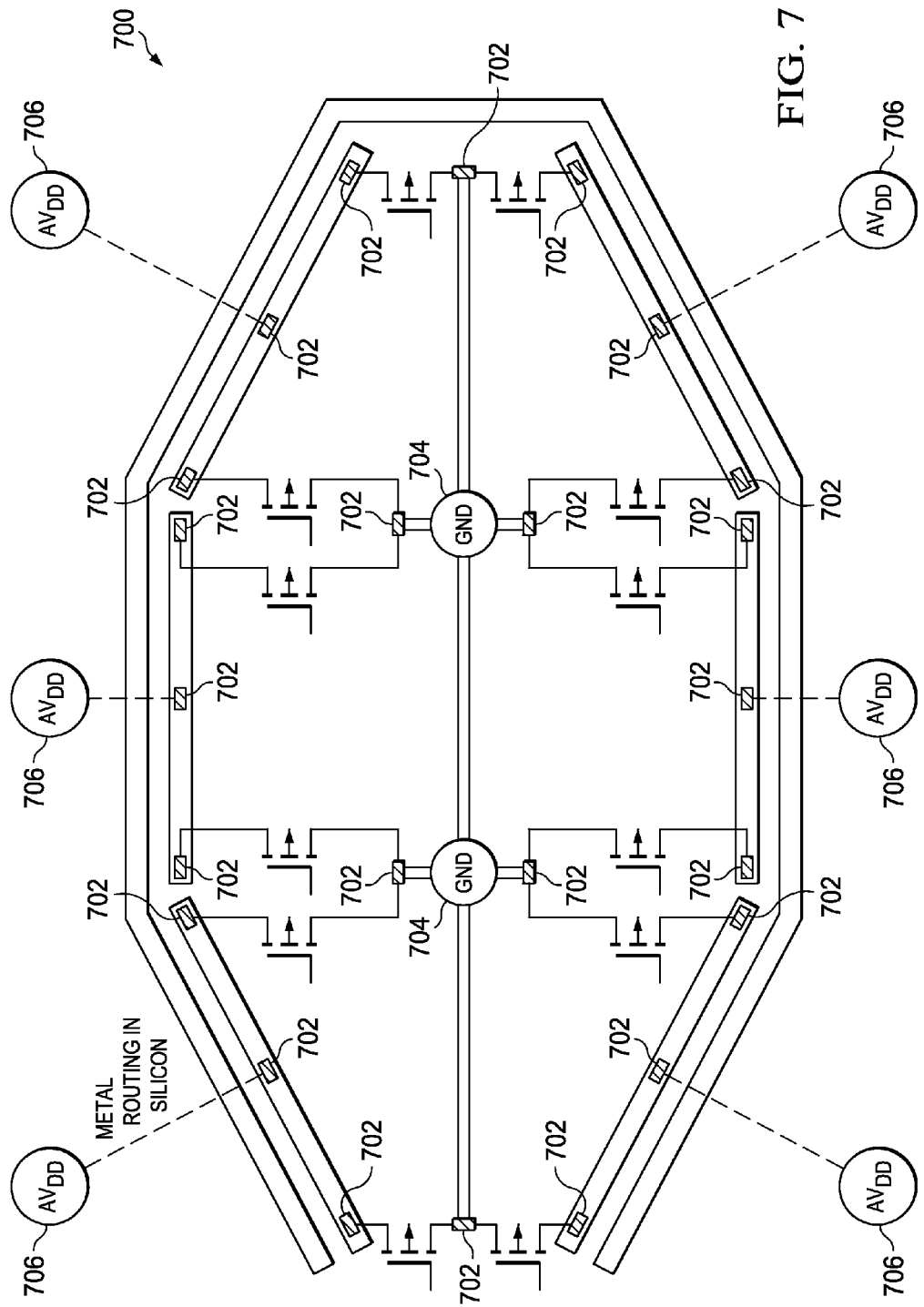
Figure 8:
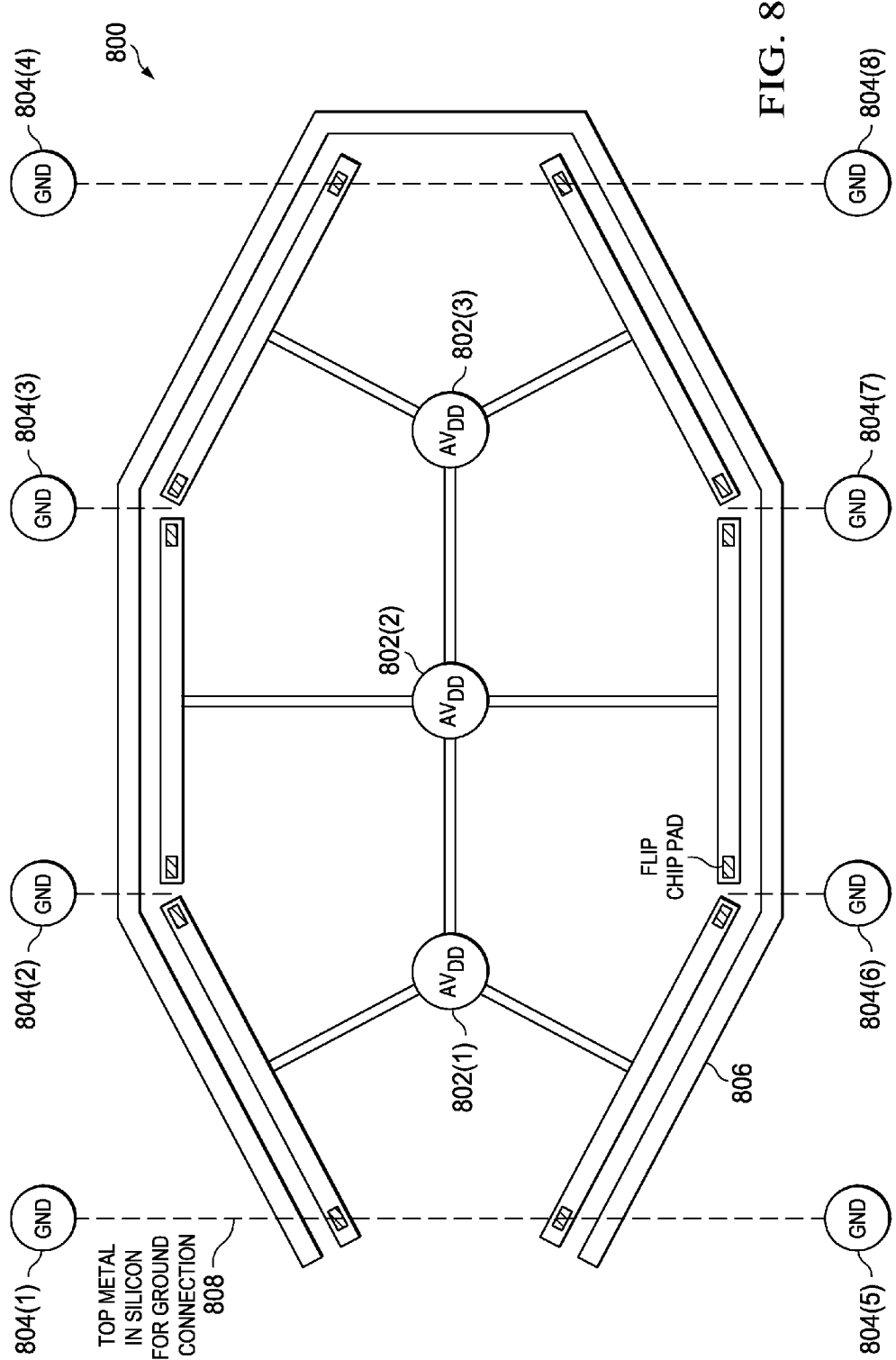
Figure 9:
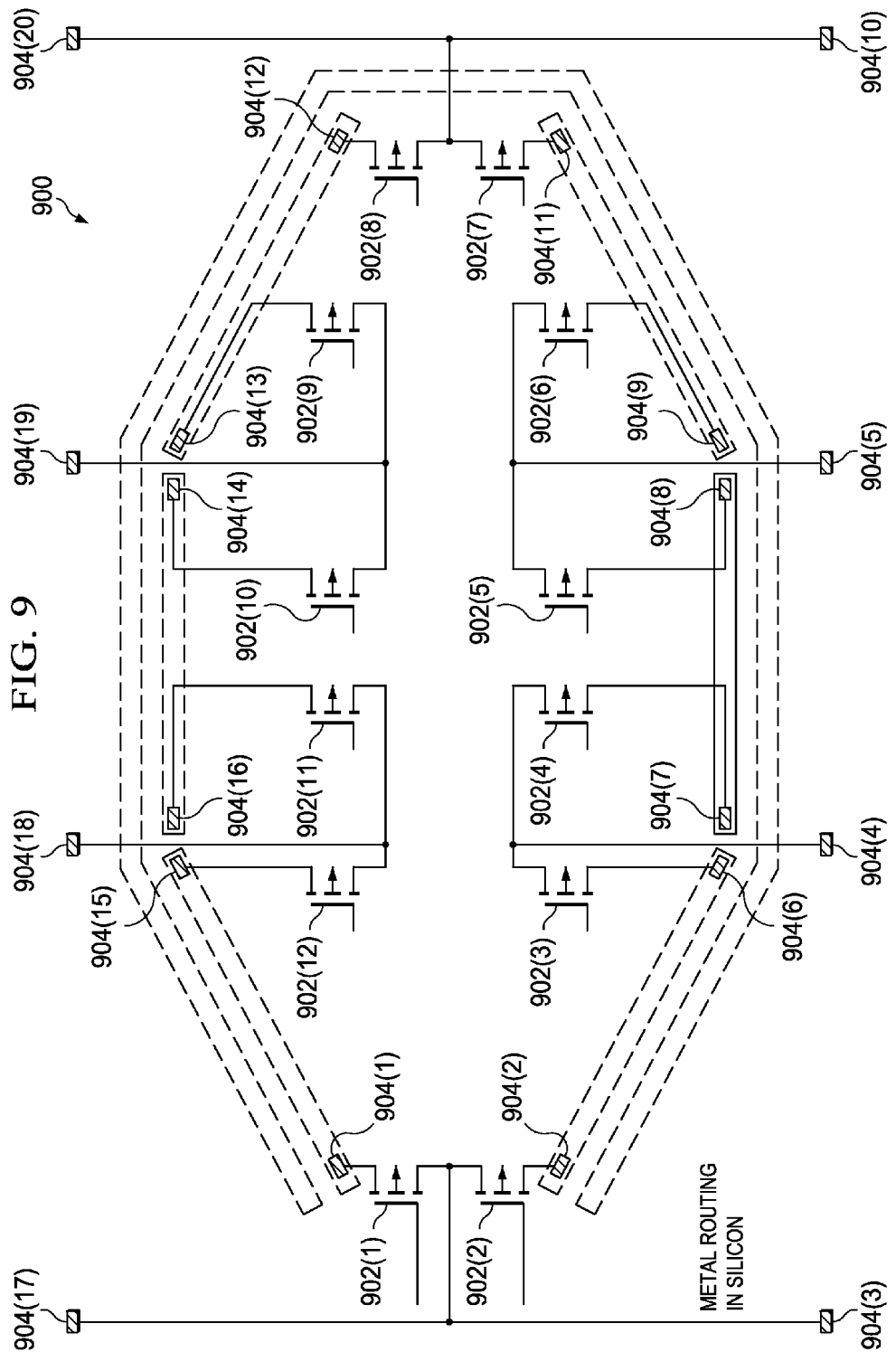
Figure 10:
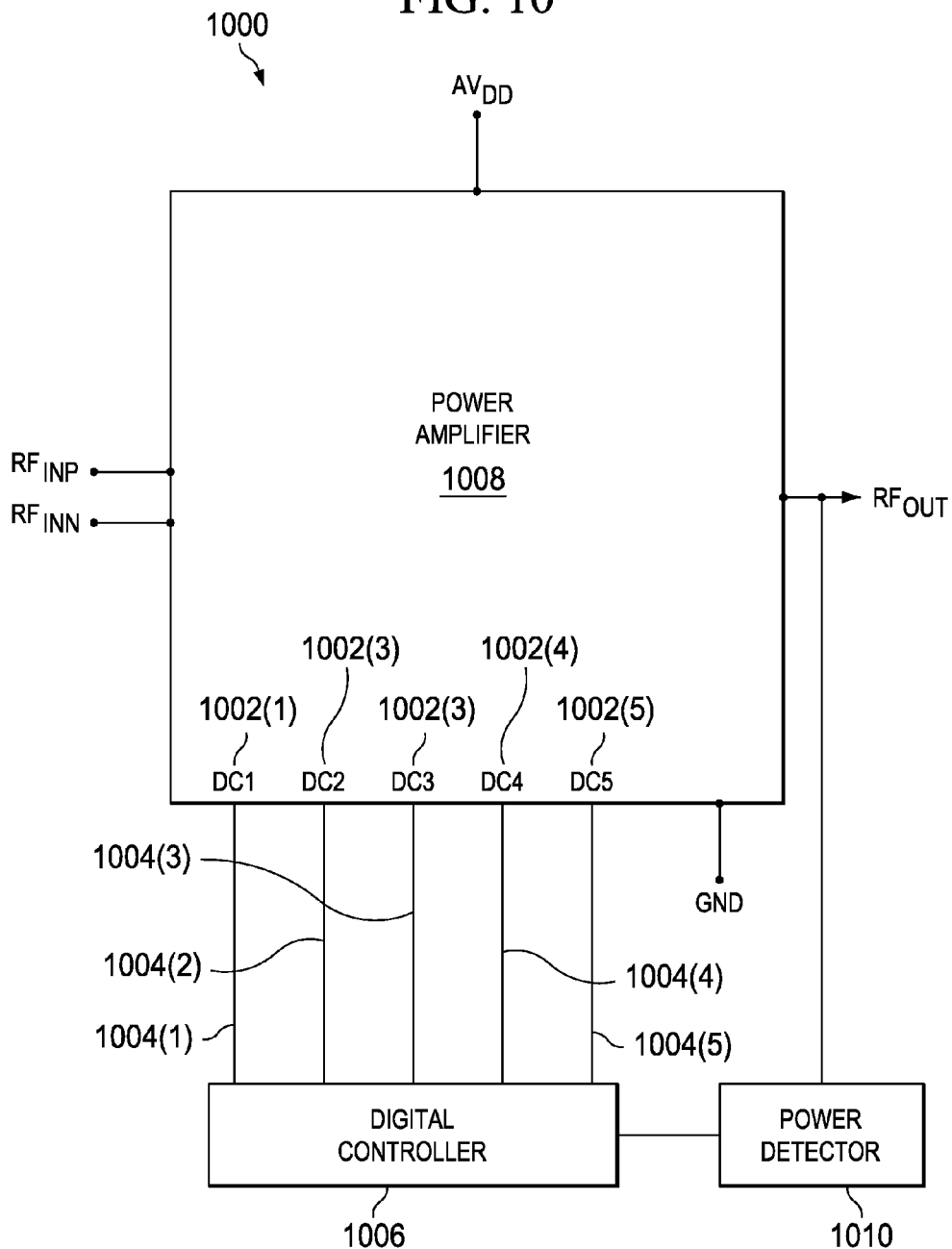
Figure 11:
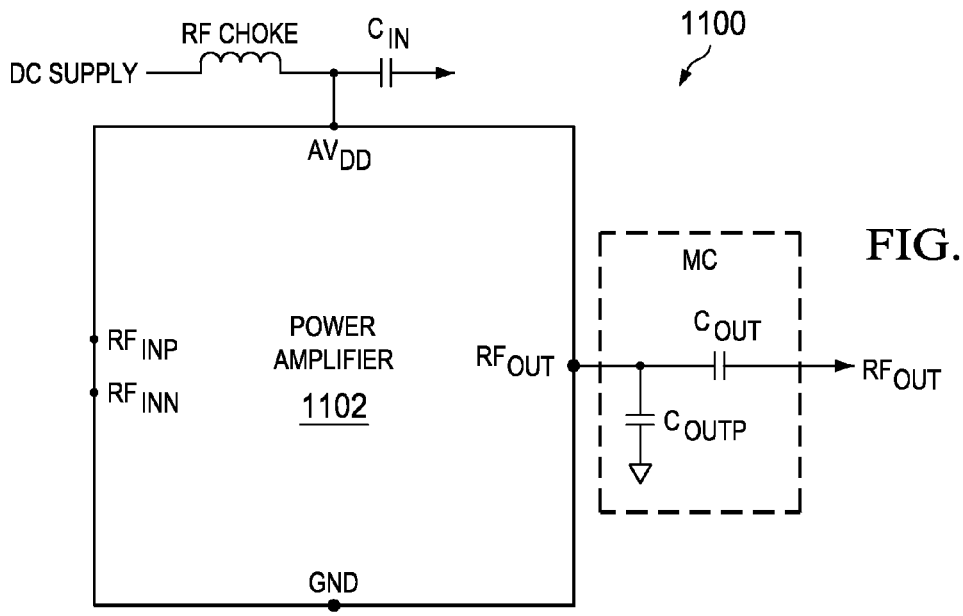
Figure 12:
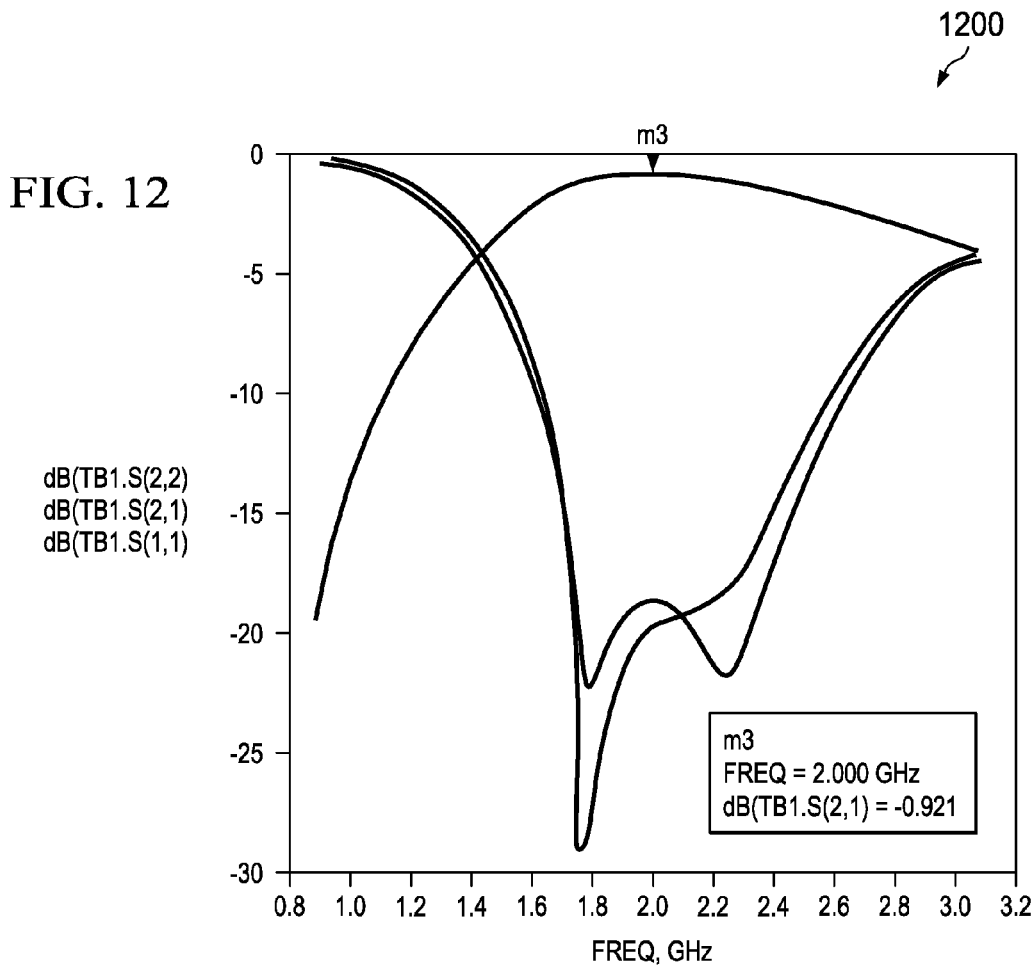
Figure 13:
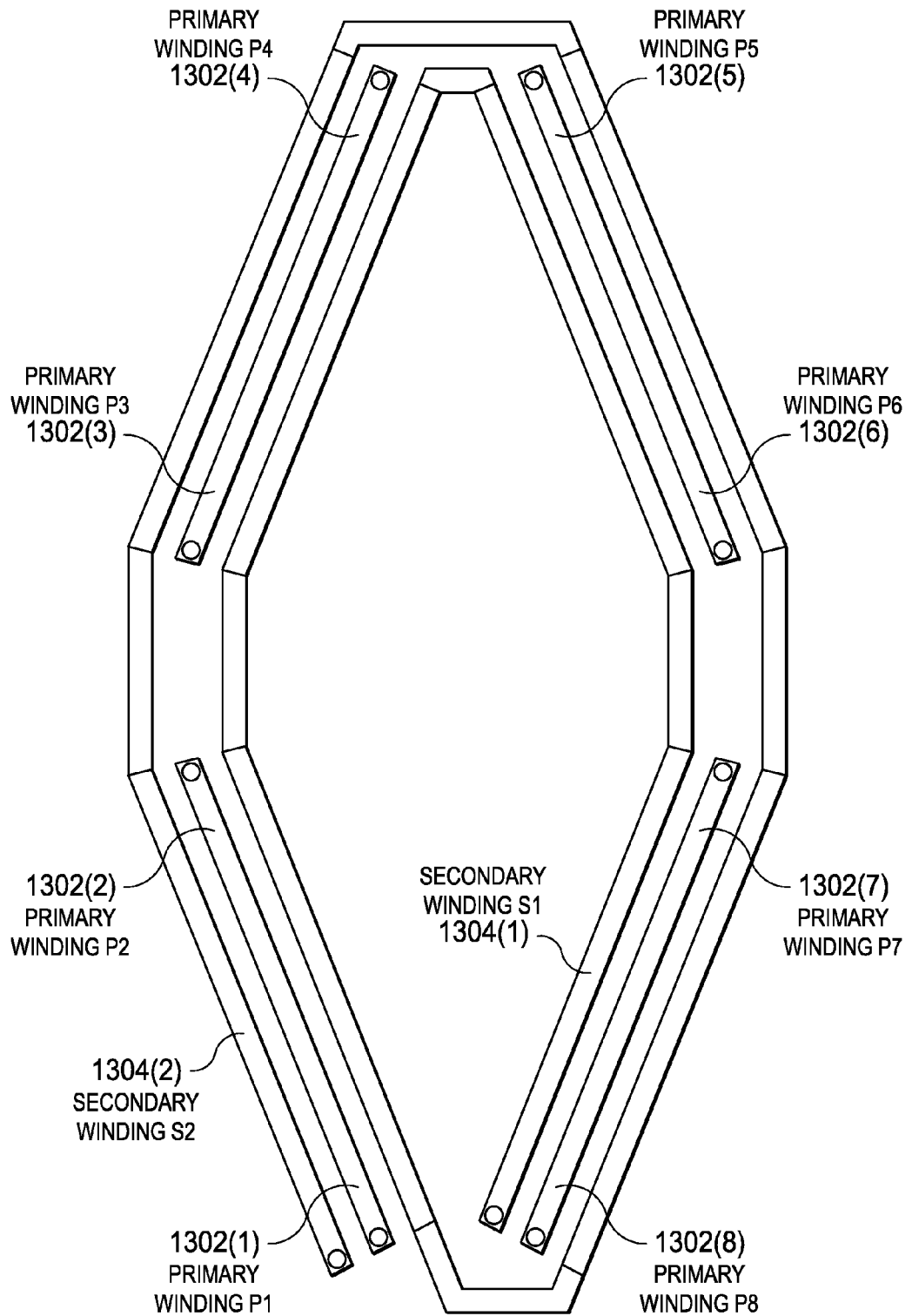
Figure 14:
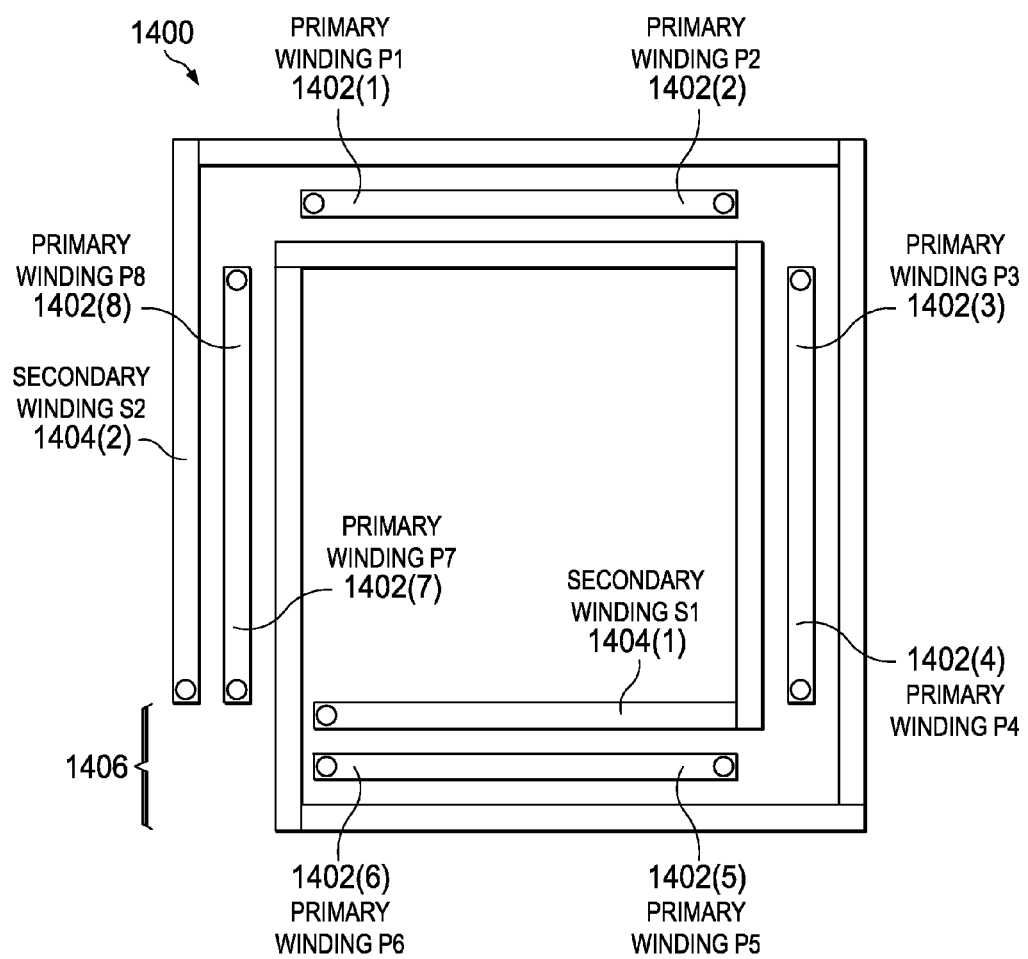
Figure 15:
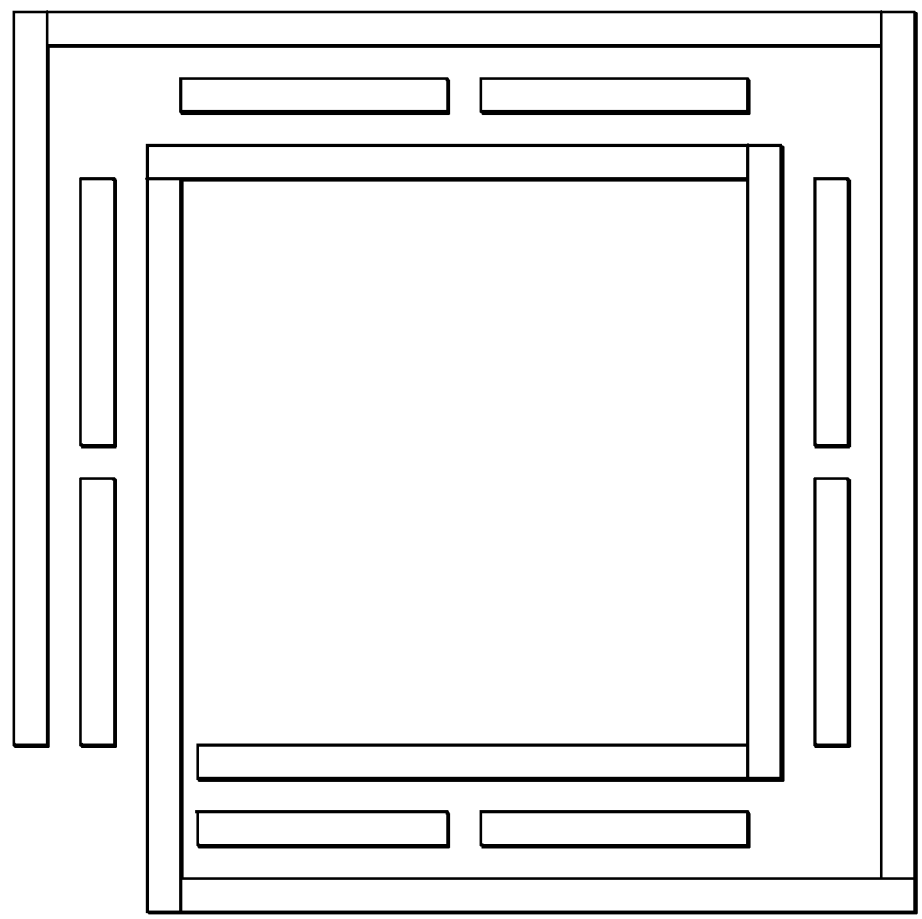
Figure 16:
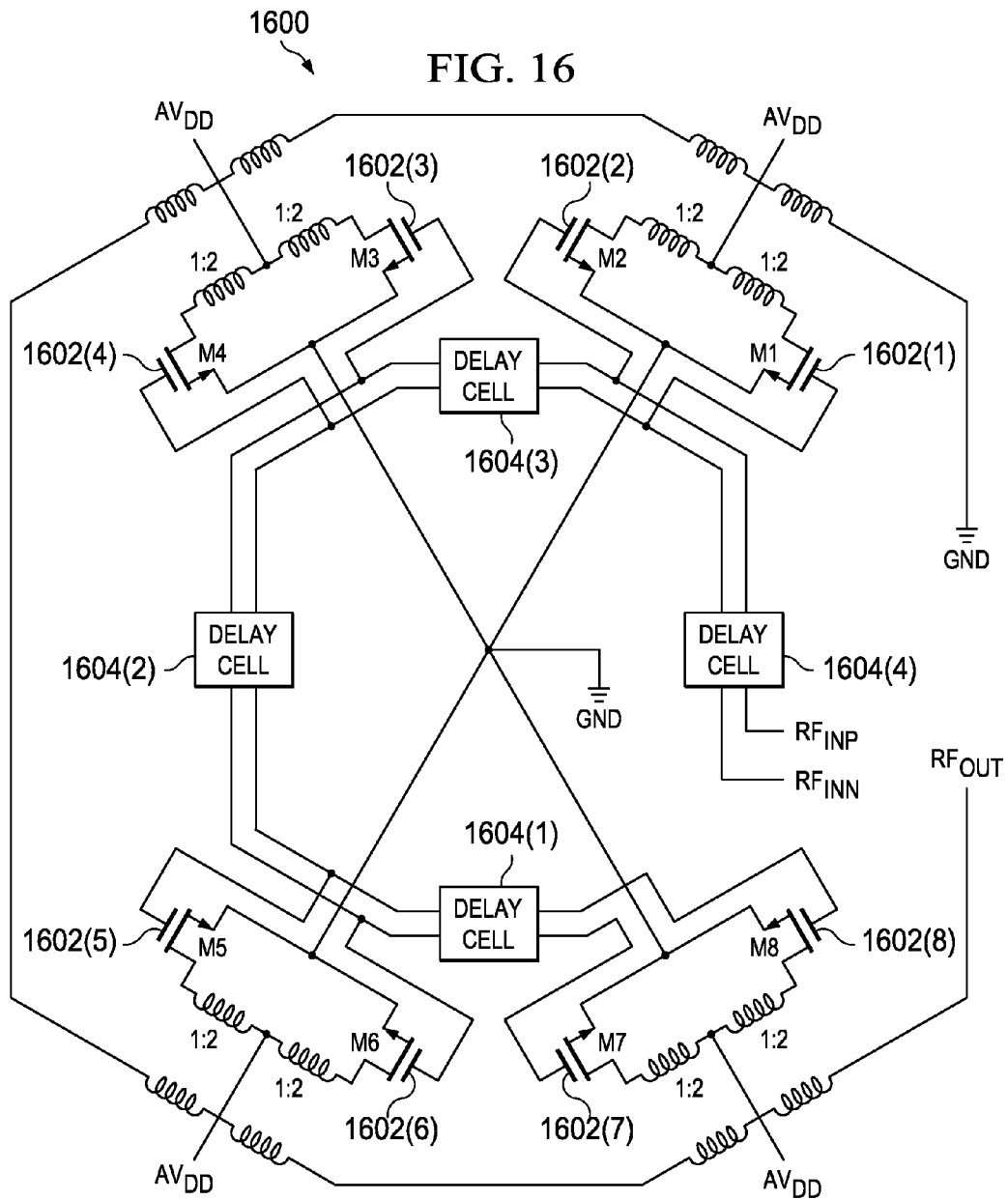
Figure 17:
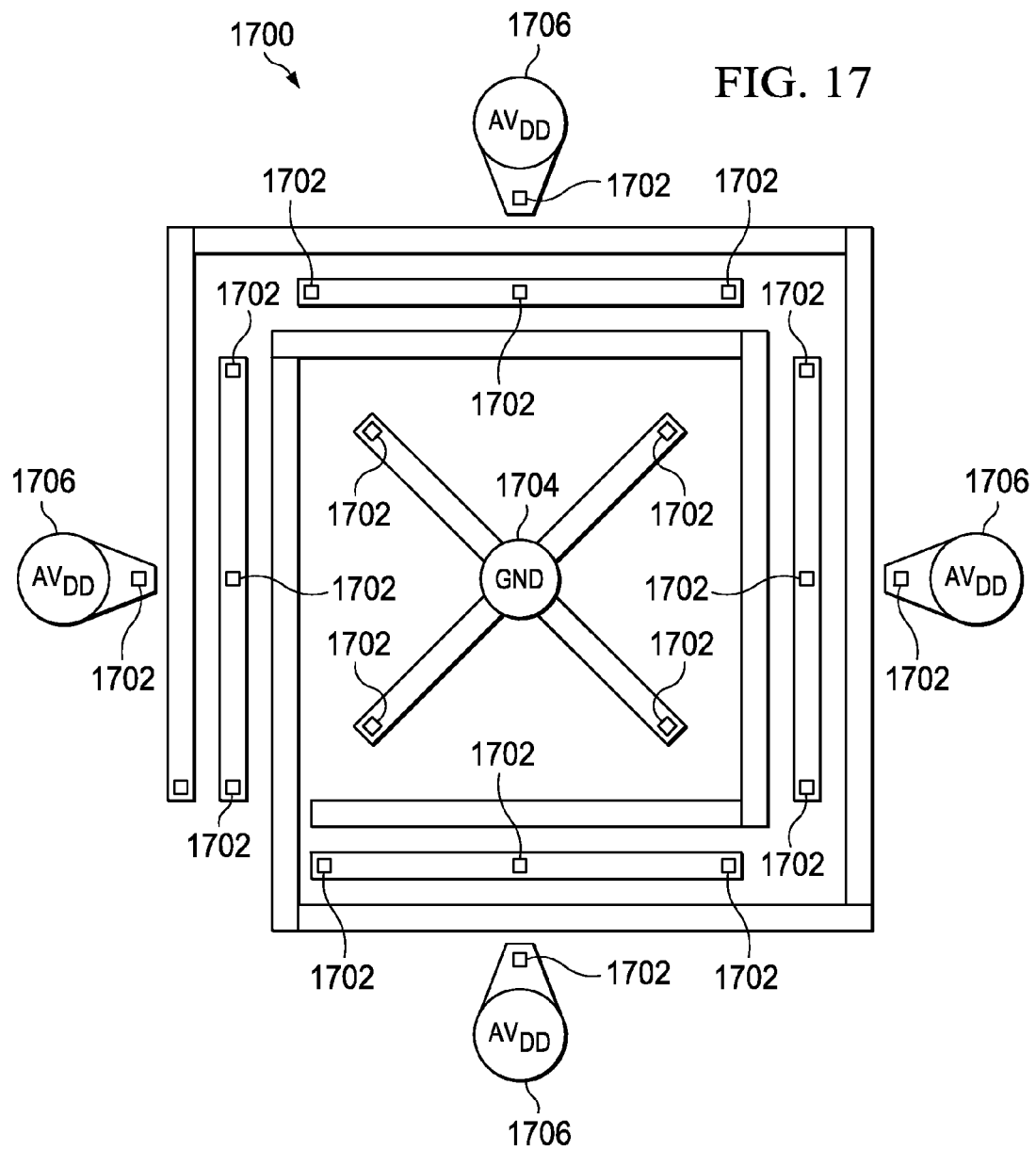
Figure 18:
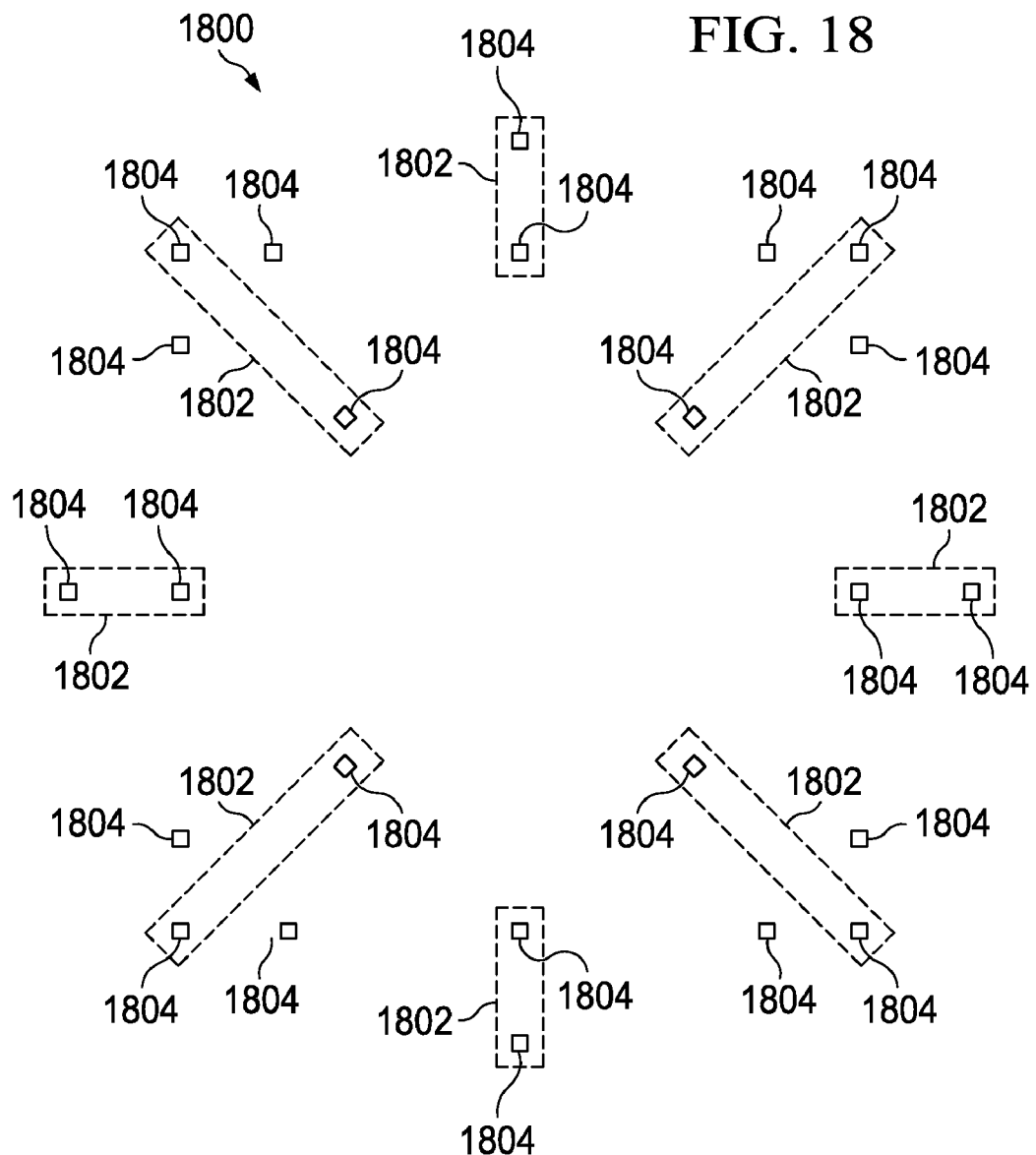
Figure 19:
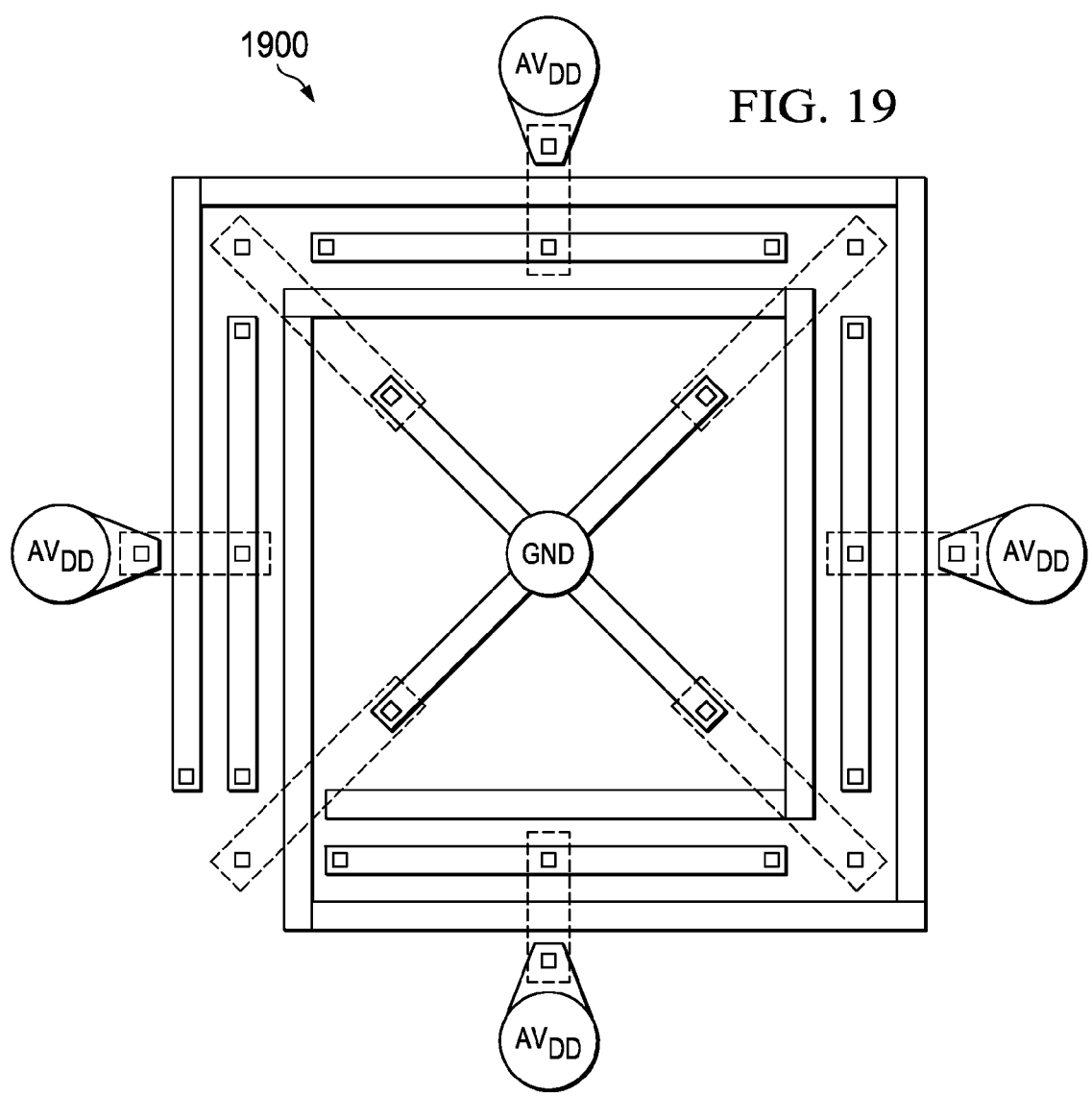
Figure 20:
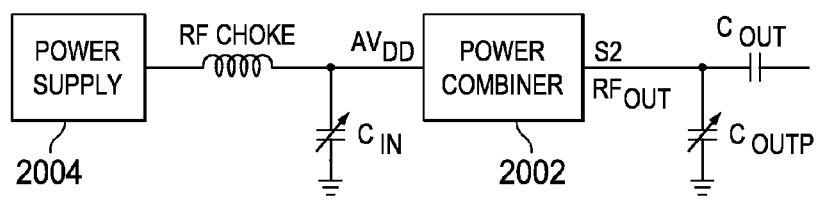
Figure 21:
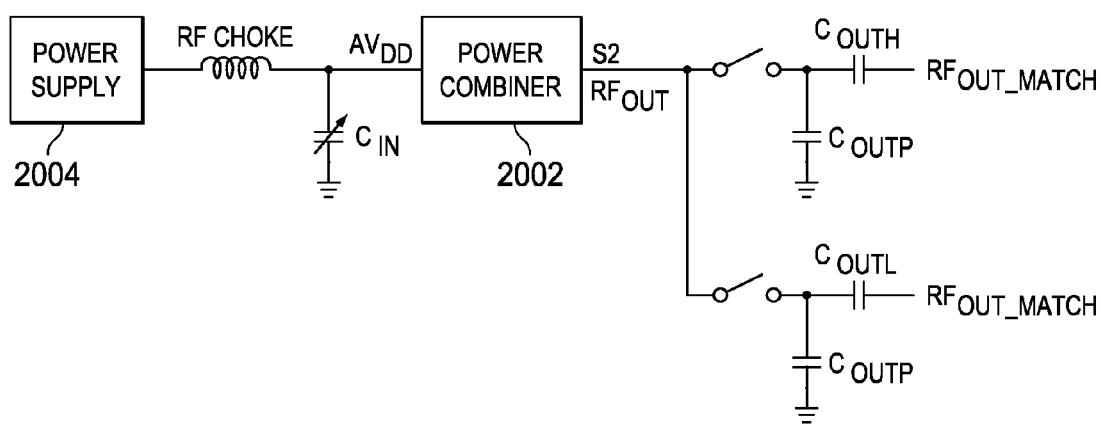
Figure 22:
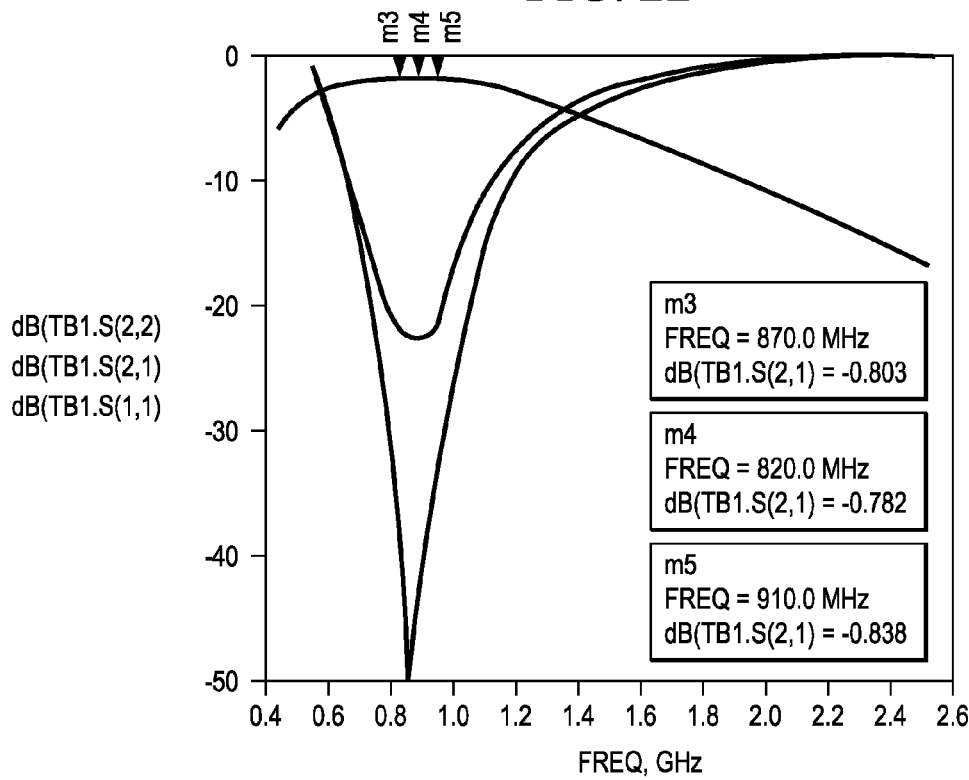
Figure 24:
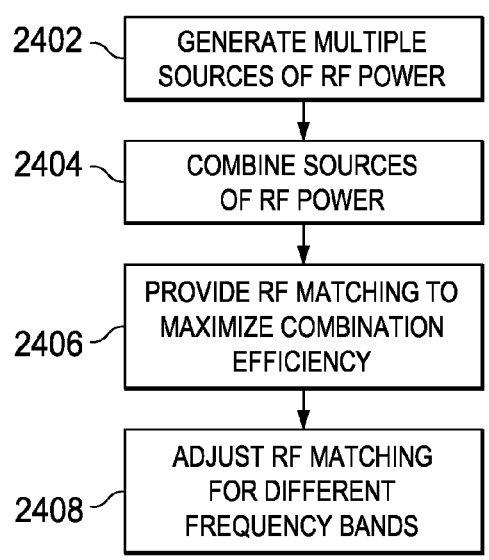
Figure 23:
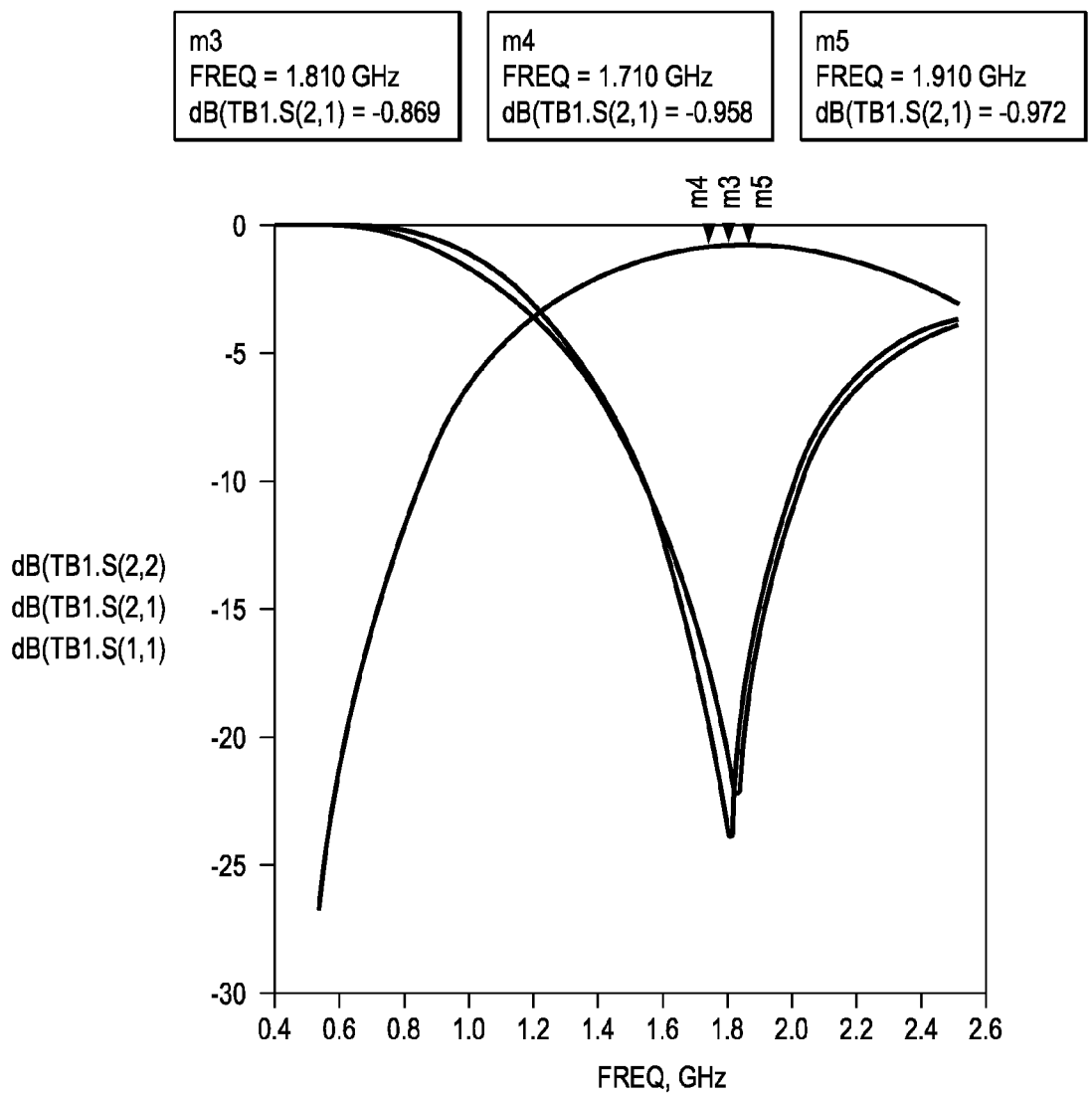

FIG. 1 illustrates a power combiner or power splitter having a number of 1:1 transformers.
FIG. 2 illustrates a CMOS RF power amplifier that includes micro amplifiers and a power combiner.
FIG. 3 illustrates top-level black-box view of micro power amplifiers with a power combiner.
FIG. 4 illustrates a cross section of a tape ball grid array.
FIG. 5 illustrates a cross section of a tape ball grid array for flip chip technology.
FIG. 6 illustrates layout of a power combiner or power splitter.
FIG. 7 illustrates connections for a power combiner and micro power amplifiers.
FIG. 8 illustrates a packaging layout.
FIG. 9 illustrates a micro power amplifier layout.
FIG. 10 illustrates a configuration diagram of an on chip calibration.
FIG. 11 illustrates a matching circuit for a power amplifier.
FIG. 12 illustrates a graph showing simulation results from a power combiner on single layer substrate.
FIG. 13 illustrates a printed layout of four 1:2 power combiner.
FIG. 14 illustrates a power combiner configured as a square.
FIG. 15 illustrates a eight 1:2 power combiner.
FIG. 16 illustrates a schematic of a CMOS power amplifier.
FIG. 17 illustrates a printed layout for micro power amplifiers and a combiner on a substrate.
FIG. 18 illustrates a layout that provides footprint for pad openings.
FIG. 19 illustrates a stack up of a substrate and integrated circuit.
FIG. 20 illustrates a matching circuit for a power amplifier.
FIG. 21 illustrates a matching circuit for low and high bands of a power amplifier.
FIG. 22 and FIG. 23 illustrate graphs showing simulation results from a power combiner on single layer substrate with matching circuits.
FIG. 24 illustrates a flowchart that shows generating RF power.

DETAILED DESCRIPTION

An exemplary power amplifier that includes a power combiner is described. The power amplifier may be radio frequency (RF) CMOS power amplifier using nanoscale technologies. The power amplifier may be included as part of a wireless communication device, such as a cellular telephone. An exemplary implementation is discussed as to a low cost, high efficiency and low loss narrow-band (i.e., fraction of the carrier RF frequency) power combiner using substrate traces printed on a chip package. An embodiment includes a low cost and power efficient power combiner printed on a package substrate and methods on how to connect the micro power amplifier and the power combiner to form a final integrated high power and high efficient nanoscale CMOS RF power amplifier. Furthermore, exemplary methods are discussed as to electrically connecting a power combiner and micro power amplifiers.

An RF power amplifier can be implemented using a low voltage nanoscale CMOS transistor having low breakdown voltage. Due to the ultra fast and highly efficient low voltage CMOS transistor available from the nanoscale technology, a final high output power and high efficient RF power amplifier can be realized using low cost CMOS technology.

An exemplary method is discussed as to implementing a low cost, high efficiency and low loss transformer-based power combiner with series resonant capacitor to resonate out the leakage inductance. Nanoscale technology (e.g., 65 nm, 45 nm, 32 nm and beyond) may be used for integrated circuit or IC (e.g., wireless IC) designs where multiple functions and/or applications are integrated to reduce final fabrication cost. In certain cases, and in particular for CMOS technology, scaling may be performed from circuit technology nodes (i.e., node to node) in order to pack more transistors into a limited space. Due to such transistor scaling, the power supply may have to be scaled as well. The maximum sustainable power supply for example may be 1.2V for a 65 nm node, and 1.1V for a 45 nm node.

These and other design, features and advantages of the present invention will become apparent with reference to the following detailed description and the drawings.

As mentioned earlier, one of the solution to deliver cellular RF power amplifier using low voltage nanoscale technology is to use power combiner, The basic idea is that instead of having a big device and having high breakdown voltage, which is very difficult to have fully integrated solution to deliver high output power, many micro power amplifiers with moderate output power and then combine the individual output power through a power combiner can be exploited.

FIG. 1 shows a power combiner or power splitter 100, depending upon the direction of the power transfer. The power combiner has a number of 1:1 transformers (the number can be an integer value N), connected in such a way that primary windings or primaries as identified by their nodes P1 102(1) to P2 102(2), and P3 102(3) to P4 102(4), and collectively as primaries 102, are electromagnetically coupled to secondary windings or secondaries as identified by their nodes S1 104(1) to S2 104(2) and collectively as secondaries 104. Primaries 102 are configured in parallel while secondaries 104 are connected in series. Since the current through the secondaries 104 is to be equal; and for elementary 1:1 transformer, the output power at the secondary output is subdivided by the number of transformers N, when the output power is referred back to the primary input. Thus, the number of N transformers to provide an output power of P follows equation (1) below:

$$N = \frac{\sqrt{2PR}}{V} \tag{1}$$

R is the output resistance and V is the peak voltage. For example, to deliver 2 W of output power into a 50Ω resistance, with a peak voltage of 1.2V, N is equaled to 12. This translates to 12 elementary or micro power amplifiers with each delivering about 167 mW of power. With an ideal power combiner, 2 W of RF output power can be realized. If the 1:1 transformers are replaced by 1:2 transformers, in other words if a primary 102 has only one turn and each of the secondaries 104 has two turns, then six micro power amplifiers are implemented in this example.

FIG. 2 shows a CMOS RF power amplifier 200 that includes micro amplifiers and a power combiner. The exemplary power amplifier 200 includes 12 transistors or micro power amplifiers collectively shown as transistors 202. The transistors 202 are connected in differential pairs. In particular, transistor 202(1) is paired with transistor 202(2); transistor 202(3) is paired with transistor 202(4); transistor 202(5) is paired with transistor 202(6); transistor 202(7) is paired with transistor 202(8); transistor 202(9) is paired with transistor 202(10); and transistor 202(11) is paired with transistor 202(12).

In this example, power amplifier 200 further includes 12 transformers 204, where transformers 204 have a 1:1 turn ratio. The secondary windings of 204 are connected in series to maximize combined power output and minimize voltage from the differential pairs of transistors 202, allowing the output power from each differential pair of the transistors 202 (i.e., micro power amplifiers) to be combined in phase.

To provide for the power output to be combined in phase, delay cells 206 are included for input lines to the differential pairs of transistors 202. As an example, a delay cell 206 can be implemented from inverter delay or from delay tap line, whose delay can be controlled in a continuous (controlling the VDD or capacitative loading) or discrete manner (controlling the number of inverters or selecting the output tap, also binary control of current tail or loading capacitance). Furthermore, the amount of delay for each delay cell can be calibrated if necessary. The delay cells can further include shut down or gating circuitry for disabling the output. The dynamic range of the power amplifier can be extended by shutting down the micro PA stages starting from the last one 206(5) in the input signal chain and ending from the second 206(1). A benefit of shutting down the micro PA stages at lower output power is that the overall current consumption is reduced and the unnecessary stages do not contribute to the RF leakage. For example, if the half of the maximum output power is needed at a given moment, then half of the output stages could be shut down. The disabled stages do not consume static bias current and do not contribute to the parasitic paths of RF leakage. It should be noted that the micro PA disable could be done through various other means.

The integrated environment of an SoC radio, in which an RF transceiver is integrated with a digital baseband and possibly an application processor, makes it possible to harness the power of digital computation and digital signal processing to accomplish that calibration goal. Additionally, available computational power during the normal radio operation makes it possible to perform on-the-fly compensation of the varying temperature and supply voltage environmental conditions.

As shown in FIG. 2, a terminal from the composite secondary winding 204 is connected to ground, and the other terminal connected to a final output port RF$_{OUT}$ 208. RF input is differential and labeled as RF$_{INP}$ 210 and RF$_{INN}$ 212. Power supply node is represented as AV$_{DD}$ 214 and ground node is represented as GND 216. Each primary winding has a center tap connected to power the power supply node and a pair of opposed terminals. Each transistor has one terminal connected to an opposed terminal of a primary winding, another terminal connected to the ground node, and a gate coupled to the RF differential inputs.

FIG. 3 shows a simplified top-level representation 300 of an array of micro power amplifiers with a power combiner. As discussed above, the power supply is identified as $AV_{DD}$ 214 and ground as GND 216. Differential inputs to the power amplifier are $RF_{INP}$ 210 and $RF_{INN}$ 212. Delay controls are identified as delay cells 206. In this illustration, the delay cells 206 delay control (DC) outputs are identified as DC1 306(1), DC2 306(2), DC3 306(3), DC4 306(4), and DC5 306(5). The output of the power amplifier is identified as $RF_{OUT}$ 208.

FIG. 4 shows a cross section 400 of a tape ball grid array (BGA). Substrate traces may be used to implement the N.times.1:1 transformer described above in FIG. 1. In packaging technologies such as BGA (including laminate BGA and tape BGA), substrate traces may be available and used to connect a bond finger to a ball. Single or multi-layer substrate traces may also be available from these package technologies. The number of layers used may depend on the complexity and the cost of the package. A typical substrate may be made from copper or aluminum, since such materials provide good conductivity. For example, copper substrate may have a thickness of about 15 mu.m (microns) with minimum width of 25 mu.m. This enables a high Q transformer and/or power combiner to be implemented. In the example, the cross section 400 includes a polyimide film 402, then an adhesive 404, then copper foil 406, and solder resist 408. A via 410 may also be implemented.

FIG. 5 shows another example of a cross section 500 of a tape BGA. In this example, the cross section 500 is that of a tape BGA with a single copper layer 502 used for flip-chip technology fabrication. A solder ball 504 makes electrical contact at the bottom of copper layer or trace 502. The top side of the copper layer 502 makes electrical contact to a die 506 through a stud bump 508 on the integrated circuit (IC) and then the IC is flipped over to make electrical connection through a flip chip process.

FIG. 6 shows a power combiner or power splitter 600, depending upon the direction of the power transfer. The power combiner 600 includes twelve 1:1 transformers, collectively referred to as transformers 602. In particular, transformers 602 are connected as power combiner 600. The rectilinear primary windings or primaries 604 are in the inner loop and the rectilinear secondary windings or secondaries 606 are in the outer loop. As an example, the width of the traces for power combiner 600 may be 25 μm with a 25 μm spacing between traces. The length of the 1:1 transformer 602 may be 500 μm. The primaries 604 can be printed on the outer loop and the secondaries 606 on the inner loop as well. For multiple substrate layers, the primaries 604 and secondaries 606 can be placed on top of each other.

FIG. 7 shows an example of connections 700 for power combiner and micro power amplifiers. Pad openings 702 represents a pad or connection point for electrical connection between the silicon and the package through stud bump (e.g., stud bump 508). Pad openings 702 may be referred to as flip-chip pads. In this example, there are a total of twelve flip chip pads or pad openings 702 for the twelve micro power amplifiers, six flip chip pads or pad openings 702 for the $AV_{DD}$ and six flip chip pads or pad openings 702 for ground or GND. The flip chip pads or pad openings 702 for the GND may be connected through substrate traces to two GND balls 704. Furthermore, the micro power amplifier sources are connected to the ground GND through the flip chip pads or pad openings 702. Note that the flip-chip pads 702 associated with the secondary winding are not shown, as various configurations (balanced, unbalanced) are possible.

In the shown implementation, micro power amplifiers' drains are connected to one end of a 1:1 transformer through the flip chip pads 702. Since the center tap of the 1:1 transformer is to connect to the power supply or $AV_{DD}$, a pad opening or flip chip pad 702 may be used to connect this point to the silicon and then through metal routing in silicon and back again to a $AV_{DD}$ ball 706. This technique allows for a single layer substrate to be used instead of multiple substrate layers, which can result in a lower final package cost. In an implementation, six balls 706 are used for $AV_{DD}$. If needed, substrate traces can be used to connect all or half of the balls together to reduce the number of balls.

FIG. 8 shows an example packaging layout 800. In layout 800, $AV_{DD}$ balls 802 are placed in the middle of the power combiner and ground or GND balls 804 are placed at the outer ring of the secondary trace 806. Three $AV_{DD}$ balls 802(1), 802(2), and 802(3) connect the power supply or $AV_{DD}$; however, it is to be appreciated that the number of $AV_{DD}$ balls can be reduced to one. The number of $AV_{DD}$ balls to be used can include consideration as to a particular power amplifier design and may depend on the amount of current density which a ball or interconnect can handle.

For ground, top metal in silicon 808 can be used to connect the micro amplifier's sources to the ground balls 804. The number of ground balls 804 will also depend on the power amplifier design, and the current density which the ball or interconnect can handle.

FIG. 9 depicts a micro power amplifier layout 900. Layout 900 may be referred to as a floor plan. The layout 900 shows how silicon and the package substrate are interconnected. As an example, a micro power amplifier 902 (i.e., transistor) is laid out in a way that the micro power amplifier 902 is located directly underneath a bond pad 904 to reduce any loss from the drain of the micro power amplifier 902 to the bond pad 904 and further save silicon area. The twelve micro power amplifiers 902 are placed directly under the flip chip pad. As discussed above, the electrical connection between the silicon and the substrate package is through a stud bump. (e.g., stud bump 508). The common ground of the differential micro power amplifier (e.g., micro power amplifiers 902) is connected to the ball by first using metal routing in the silicon 906 to a bond pad 904. Then, the bond pad 904 is connected to the flip chip pad via a stud bump, and finally the bond pad 904 is connected to the ball through cooper routing on the package substrate. The example describes twelve 1:1 transformers which are connected in a power combiner; however, it is to be appreciated that a higher number of 1:1 transformers may be implemented. In other implementations, where higher N value transformers are used, additional "straight" 1:1 transformers can be inserted in the middle of the power combiner.

FIG. 10 shows a block diagram for "on chip" calibration circuitry 1000. Output power from each micro power amplifier is combined in phase. The 1:1 transformer is placed in a square (i.e., attain a square shape power combiner), and the input delays from the RF source to the input of the micro power amplifier should be matched and the delay in the secondary should be insignificant; however this may be impractical. For example, to attain a square shape power combiner can waste a lot a silicon area and make full integration more difficult. Therefore, the power combiner can be printed like a small eye opening, allowing the power combiner to be placed at the edge on one side of the package. In order to make sure that all the output powers from the micro power amplifiers are combined in phase, delay circuits are introduced in the RF input line as shown and discussed in FIG. 2.

In the particular example, a total of five differential delay blocks are provided and represented as 206(1) . . . (12) with their delay control inputs represented as DC1 1002(1), DC2 1002(2), DC3 1002(3), DC4 1002(4), and DC5 1002(5). Each delay input DC 1002 respectively has its own delay line represented by lines 1004. The delay blocks DC 1002 can include inverters and some control logic in such a way that the input to the output delays can be controlled digitally. In this implementation, a digital controller 1006 can control delay blocks through their inputs DC 1002 in power amplifier 1008, where digital controller 1008 receives an input from a power detector 1010. Due to the process, voltage and temperature variations, the power detector 1010 can be incorporated either on chip off chip to detect the output power from the power amplifier due to a single tone excitation for example, and then the digital controller 1006 can control all the delay control buses or lines 1004 in such a way to get maximum power. The coupling from the RF output to the power detector 1010 is engineered not to excessively load the RF output and can be electrical, magnetic or electromagnetic.

The calibration circuitry 1000 of FIG. 10 can also be used to compensate for varying antenna mismatch conditions or voltage standing wave ratio (VSWR). By varying relative time delay of certain micro PA stages, their relative phase is changed, which could help with a constructive addition to the reflected wave from the antenna. Since the VSWR variations are slow (e.g., on the order of ms), a dedicated hardware or the on-die processor could be used as a compensation engine. The power detector 1010, in this case, can measure total radiated, forward or reflected power.

FIG. 11 shows an RF matching circuit 1100. Circuit 1100 includes the concepts described above, as applied to power amplifier 1102. As discussed above in FIG. 2, a transformer turn ratio of 1:1 is described. It is ideal and desirable to have a high magnetic coupling between the primary and secondary windings (i.e., primaries and secondaries) of the transformer. In order to achieve this, the primary and secondary traces of the 1:1 transformer should be placed very close to each other and have sufficient length. Due to the substrate technology limitations, as well as area and cost limitations, high magnetic coupling between the primary and secondary and low loss at radio frequency cannot be easily achieved. The matching circuit 1100 provides for power combiner with a matching circuit. In particular, the matching circuit includes $C_{OUT}$ and $C_{OUTP}$ at the $RF_{OUT}$, and $C_{IN}$ at $AV_{DD}$. The capacitors, together with the parasitics of primary and secondary winding inductances, form series resonant circuits. At close to resonant frequencies, the leakage inductance of the transformers is resonated out and does not substantially contribute to transformer losses. Hence, an efficient power combination can be realized with low-coupling-ratio transformers. The matching circuit 1100 may be adjusted in order to minimize effects of antenna mismatch.

FIG. 12 shows a simulation result graph 1200 from a power combiner printed on a single layer substrate. The S(2,1) shown that is less than 1 dB is achieved at 2 GHz, which is close to the resonating frequency of the leakage inductance and the matching circuit capacitors. Due to the relatively narrow band nature of the power combiner, $C_{IN}$ can partially be integrated on to a chip and made programmable, allowing the ability to tune the power combiner at different bands. For example, applications may be found for low band and high band in a quad-band power amplifier for GSM cellular application. This can allow for a single RF power amplifier to cover multiple bands.

FIG. 13 shows a four 1:2 power combiner 1300 as a printed circuit. The eight primary windings or primaries are identified as primary winding P1 1302(1), primary winding P2 1302(2), primary winding P3 1302(3), primary winding P4 1302(4), primary winding P5 1302(5), primary winding P6 1302(6), primary winding P7 1302(7), and primary winding P8 1302 (8). It is noted that the center tap in each of the four primary lines is implied. The two secondary windings or secondaries are identified as secondary winding S1 1304(1) and secondary winding S2 1304(2) with a non-physical separation in the middle.

To obtain a single-ended output, terminal of the secondary winding S1 1304(1) can be grounded and the output delivered via terminal of S2 1304(2). The primaries 1302 can be electrically excited either differentially or single-ended (i.e., it will create the 4.times. 1:1 transformer). The primaries 1302 may be electrically excited differentially as pairs. In particular, the pairing in this example are primary winding P1 1302 (1) with primary winding P2 1302(2), primary winding P3 1302(3) with primary winding P4 1302(4), primary winding P5 1302(5) with primary winding P6 1302(6), and primary winding P7 1302(7) with primary winding P8 1302(8). This results in an eight 1:2 power combiner.

In this example, the midpoint of the traces P1 1302(1) and P2 1302(2); P3 1302(3) and P4 1302(4); P5 1302(5) and P6 1302(6); and P7 1302(7) and P8 1302(8) are AC ground. Alternatively, if P1 1302(1), P3 1302(3), P5 1302(5), and P7 1302(7) are electrically excited simultaneously and P2 1302 (2), P4 1302(4), P6 1302(6) and P8 1308(8) are AC grounded, then the power combiner 1300 becomes a four 1:2 power combiner. In order to achieve high electro-magnetic coupling between the primaries 1302 and secondaries 1304, the following three parameters can be tailored by: 1) spacing between the traces, 2) the length of the traces, and 3) the thickness of the traces. It should be appreciated that other parameters may also be changed, such as the permittivity and thickness of the substrate. If cost of implementation is an important consideration, parameters directed to minimizing the traces, minimizing spacing, and making the final power combiner area as small as possible are considered.

It is to be appreciated that the power combiner 1300 can also be drawn in any other shape and the final shape is determined through simulations that consider area trade-off to meet specifications. Typically, it is desirable to place a power amplifier at one edge of a chip. The shape of the power combiner in 1300 is shaped like an eye (i.e., eye-shaped). The eye-shape with a narrow eye opening is an example of an optimum shape in regards to area trade-off and ease of chip floor planning.

FIG. 14 shows a power combiner 1400 as a square shape. In particular the power combiner 1400 is printed on a package's substrate as a square shape. In this example, the primary windings or primaries are identified as primary winding P1 1402(1), primary winding P2 1402(2), primary winding P3 1402(3), primary winding P4 1402(4), primary winding P5 1402(5), primary winding P6 1402(6), primary winding P7 1402(7), and primary winding P8 1402(8). The secondaries or secondary windings are identified as S1 1404(1) and S2 1404(2). In this example, the length of the primary traces are kept the same as that in eye-shaped power combiner 1300 of FIG. 13; however, the primary traces can be extended by a length 1406 and maintain the same functionality.

FIG. 15 shows a 16 1:2 power combiner 1500. Each primary winding is assumed to have a center tap node. The power combiner 1500 particularly shows how the number of transformers may be increased (i.e., increase from examples discussed in FIG. 13 and FIG. 14. In general, similar implementations may be provided for N number of 1:2 power combiners or power splitters on package substrates. In other words, the number of transformers can vary accordingly to desired application.

FIG. 16 shows a CMOS power amplifier 1600. The schematic of CMOS power amplifier 1600 provides N number of micro (elementary) power amplifiers that deliver medium power and high power added efficiency (PAE) with low supply voltage. Each output power is combined through N1:2 transformers that are connected as a power combiner. The N1:2 power combiner or power splitter described above, and specifically the package substrate may be implemented as part of this CMOS power amplifier. As discussed above and further below, flip chip technology may be implemented in providing a final CMOS power amplifier product.

In this example, the number of transformers or N is equal to eight. The eight micro power amplifiers are identified as M1 1602(1), M2 1602(2), M3 1602(3), M4 1602(4), M5 1602(5), M6 1602(6), M7 1602(7), and M8 1602(8). The micro power amplifiers 1602 are driven differentially via delay versions of the RF inputs labeled $RF_{INP}$ and $RF_{INN}$. The drains of micro power amplifiers 1602 connected to eight inputs of the composite primary winding. The sources of the micro power amplifiers are connected to ground. The DC power supply for the micro power amplifiers are labeled GND or $AV_{DD}$.

For single ended output purposes, one end of a combined secondary winding of a transformer may be grounded and the other end provided as an RF output or $RF_{OUT}$. In order to maximize output power, each output power from the micro power amplifiers 1602 is combined in phase. Delay cells identified as 1604 are included to allow phase combination. Delays of the delay cells 1604 are adjusted in such a way that the output power from each of the macro power amplifiers 1602 are to be combined in phase, and can maximize total power or forward power. Furthermore, the delays of delay cells 1604 may be performed to minimize effects of antenna mismatch. The differential pair M1 1602(1) and M2 1602(2) is excited first, and the differential pair M7 1602(7) and M8 1602(8) is excited last. The output signal from the first differential pair M1 1602(1) and M2 1602(2) electro-magnetically couples to the secondary winding and travel last to $RF_{OUT}$. This type of signal excitation is a first in last out (FILO) scenario. The number of micro power amplifiers 1602 and transformers can be a minimum of one to maximum of N.

FIG. 17 shows a printed layout 1700 for micro power amplifiers and a combiner on a substrate. When a determination is made as to the number of micro power amplifiers with power combiner functions schematically, the printed power combiner 1700 is created. In particular, a layout is determined as to how an IC will include micro power amplifiers and the power combiner, and interactions between the micro power amplifiers and the power combiner. In order to have electrical contacts between the printed power combiner and the IC, the printed power combiner includes pads 1702, also known as flip chip pads. The final design of the power amplifier includes ground and power supply connections. In this example, four ground connections are connected to the solder ball labeled GND 1704 and four power supply lines have been connected to the power supply balls labeled $AV_{DD}$ 1706. It is to be appreciated that the number of balls 1704 and 1706 for the GND and $AV_{DD}$ can be varied depending on the application and cost. For example, to reduce the number of $AV_{DD}$ balls 1706 can be reduced to one; copper trace from the package substrate can be used to connect the power supply connections and then connect the power supply connections to a single $AV_{DD}$ ball 1706. The balls 1704 and 1706 are electrically connected to the bottom of the copper traces according to the cross section shown as shown in FIG. 5. By arranging the balls 1704 and 1706 (i.e., contact points) and traces (e.g., copper traces) in this manner, a single layer substrate is implemented to complete a CMOS power amplifier.

FIG. 18 shows a layout 1800 that provides a footprint for pad openings. Specifically, after the layout of FIG. 17 is determined, design is made (which may be directed to lead to fabrication) as to an IC having pad openings that match a foot print of flip-chip. The IC layout 1800 includes metal traces 1802 for interconnections and pad openings 1804. The micro power amplifier may then be placed underneath the bond pads to reduce any interconnect loss from the drain to the bond pads and also help to utilize the silicon area efficiently. The IC with layout pattern 1800 may then be sent for stud bump applications where a bond wire is bonded to a bond pad and the other end is cut leaving a very short gold ball on top of a bond pad of the IC 1800. The substrate is preheated to the appropriate temperature with solder inside the flip chip pads. Then, the IC 1800 is flipped over and the solder from the flip chip pads 1804 will make connection between the substrate and the IC.

FIG. 19 shows a stack up 1900 of the substrate and the IC. Stack up 1900 shows interconnections by overlapping the drawings in FIG. 17 and FIG. 18. In an implementation, electrical connections from sources of micro power amplifiers to the GND ball can include metal traces in the silicon, small pieces of bond wire, and copper traces in the substrate and to the solder ball.

FIG. 20 shows a matching circuit 2000. The matching circuit 2000 allows a single power amplifier to operate at different frequency bands. As shown schematically in FIG. 16, the elementary transformer turn ratio is 1:2. It is an objective to achieve high electromagnetic coupling between the primary and secondary windings. In order to achieve this objective, the primary and secondary traces of the 1:2 transformers are placed close to each other and are given sufficient length. High electromagnetic coupling between the primary and secondary windings and low loss at radio frequency cannot be achieved easily, due in large part to substrate technology, area limitation, and cost limitation. The matching circuit 2000 is designed to address these issues. A narrow band power combiner as described above is used with the matching circuit 2000. The power combiner is identified as 2002. Power combiner 2002 connects to a power supply 2004, and includes an $AV_{DD}$ node or power supply node. A second node is identified as S2 (S1 assumed to be grounded). The matching circuit 2000 includes a capacitor $C_{IN}$ that connects the $AV_{DD}$ node to ground through an RF choke to provide a DC supply via the power supply 2004, and capacitor $C_{OUT}$ that connects from S2 or $RF_{OUT}$ node to $C_{OUTP}$ that connect the S2 or $RF_{OUT}$ node to ground. Both or either of $C_{IN}$ and $C_{OUTP}$ can be realized as analog or digitally varying capacitors that would tune out parasitic capacitances of the primary and secondary transformer windings in order to achieve low-loss power transfer and thus highly efficient PA that can operate in various frequency bands. A calibration method similar to that shown in FIG. 10 could be used, except that the digital controller 1006 would produce control output to adjust the capacitances of $C_{IN}$ and $C_{OUTP}$.

The values of the three capacitors $C_{IN}$, $C_{OUT}$, and $C_{OUTP}$, can be optimized for minimum loss (S21 parameter) from the primaries to the secondary output and reasonable S11 and S22. $C_{IN}$ can be integrated in the IC or its package if needed. If $C_{OUT}$, and $C_{OUTP}$ are at a secondary output, they may not be able to be integrated with the IC. Due to the narrow band nature of this power combiner, $C_{IN}$ can be integrated in the IC and made programmable, allowing the ability to tune the power combiner at different bands; for example, low band and high band in a quad-band power amplifier for GSM cellular application. Furthermore, the matching circuit 2000 can be built using a varactor or capacitor with switches.

FIG. 21 shows a modified matching circuit 2100. In particular, the matching circuit 2100 provides capability to cover low and high frequency bands using one power amplifier by tuning the capacitance of $C_{IN}$. In this case, the power amplifier produces two separate outputs, each for a separate frequency band.

FIG. 22 and FIG. 23 respectively show S21 and S22 simulation results 2200 and 2300 from a power combiner printed on a single layer substrate with matching circuits. It demonstrates that in the described apparatus and methods, with appropriately selected values of the matching circuit components, the power transfer efficiency in various desired frequency bands can be maximized and overall power losses minimized.

FIG. 24 is a flowchart 2400 that shows generation of RF power. The flowchart may be particularly implemented by the architectures described above; however, it is to be appreciated that other architectures may implement the blocks described in flowchart 2400.

At block 2402, multiple sources of RF power are generated. For example, the multiple sources of RF power may be from micro amplifiers in a power combiner as described above. In generating the multiple sources of RF power, a subset of the micro amplifiers maybe disabled as described above.

At block 2404, the multiple sources are combined, which may be by power addition in an exemplary implementation as described above. Further as described above, the combining may include resonating out parasitic inductances of transformers of a power combiner.

At block 2406, RF matching is provided to maximize combination efficiency, as described in the examples discussed above.

At block 2408, different frequency bands may be supported by adjusting the RF matching for the different frequency bands.

CONCLUSION

The above-described systems, devices, and methods describe providing a power amplifier having a power combiner and micro power amplifiers in a low cost and efficient IC/package combination.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A power amplifier comprising:
  A. an RF INP input lead and an RF INN input lead;
  B. a first transistor having a first terminal coupled to the RF INN input lead, a second terminal connected to circuit ground, and a third terminal;
  C. a second transistor having a first terminal coupled to the RF INP input lead, a second terminal connected to circuit ground, and a third terminal;
  D. a first trace having opposed ends with an end contact at each end and a middle contact midway between the ends, one end contact being connected with the third terminal of the first transistor, the other end contact being connected with the third terminal of the second transistor, and the middle contact being connected with a circuit supply voltage;
  E. a second trace having opposed ends with an end contact at each end, one end contact of the second trace being connected to circuit ground, a first portion of the second trace being arranged with a portion of the first trace between the one end contact and the middle contact to form a first transformer, a second portion of the second trace being arranged with a portion of the first trace between the other end contact and the middle contact to form a second transformer; and
  F. an RF output lead coupled to the other end contact of the second trace.

2. The power amplifier of claim 1 including:
  i. a third transistor having a first terminal coupled to the RF INN input lead, a second terminal connected to circuit ground, and a third terminal,
  ii. a fourth transistor having a first terminal coupled to the RF INP input lead, a second terminal connected to circuit ground, and a third terminal,
  iii. a third trace having opposed ends with an end contact at each end and a middle contact midway between the ends, one end contact being connected with the third terminal of the third transistor, the other end contact being connected with the third terminal of the fourth transistor, and the middle contact being connected with the circuit supply voltage, and
  iv. a third portion of the second trace being arranged with a portion of the third trace between the one end contact and the middle contact to form a third transformer, and a fourth portion of the second trace being arranged with a portion of the third trace between the other end contact and the middle contact to form a fourth transformer.

3. The power amplifier of claim 2 in which the second and third transistors are arranged as a differential pair.

4. The power amplifier of claim 2 including a delay cell having a first input coupled to the RF INP input lead, a second input coupled to the RF INN input lead, a first output coupled to the first input, and a second output coupled to the second input, the first terminal of the third transistor being connected to the first output of the delay cell, and the first terminal of the fourth transistor being connected to the second output of the delay cell.

* * * * *